US00RE35693E

United States Patent [19]

Kerul et al.

[11] E Patent Number: Re. 35,693

[45] Reissued Date of Patent: Dec. 16, 1997

[54] LEADLESS CHIP CARRIER SOCKET

[75] Inventors: Joseph A. Kerul, Girard, Ohio; Donald E. Ralstin, South Bend, Ind.

[73] Assignee: Wells Electronics, Inc., South Bend, Ind.

[21] Appl. No.: 406,734

[22] Filed: Mar. 20, 1995

Related U.S. Patent Documents

Reissue of:

[64] Patent No.: 4,623,208
Issued: Nov. 18, 1986
Appl. No.: 719,718
Filed: Apr. 3, 1985

[51] Int. Cl.[6] ..... H01R 9/09; H01R 13/629

[52] U.S. Cl. ..... 439/266

[58] Field of Search ..... 439/68–73, 266, 439/264

[56] References Cited

U.S. PATENT DOCUMENTS

| | | | |
|---|---|---|---|
| 3,753,211 | 8/1973 | Pauza et al. | 439/264 |
| 3,763,462 | 10/1973 | Ecker | 439/635 |
| 4,332,431 | 6/1982 | Bobb et al. | 439/267 |
| 4,491,377 | 1/1985 | Pfaff | 439/266 |
| 4,715,823 | 12/1987 | Ezura et al. | 439/267 |

OTHER PUBLICATIONS

IBM Bulletin, Brearley, vol. 13, No. 9, p. 2590, Feb. 1971.

*Primary Examiner*—Neil Abrams
*Attorney, Agent, or Firm*—Baker & Daniels

[57] ABSTRACT

A leadless chip carrier socket which includes conductive contacts which electrically contact the carrier. The contacts include an outwardly extending cantilevered projection to allow the contacts to be shifted outwardly on downward engaging movement of the top of the socket to allow insertion or removal of the carrier.

16 Claims, 3 Drawing Sheets

LEADLESS CHIP CARRIER SOCKET

Matter enclosed in heavy brackets [ ] appears in the original patent but forms no part of this reissue specification; matter printed in italics indicates the additions made by reissue.

BACKGROUND OF THE INVENTION

This invention relates to a socket and will have application to a carrier socket for a leadless integrated circuit.

During the last several years the integrated circuit (IC) has completely revolutionized the electronics industry. An IC in its miniaturized form is made into a chip which is normally mounted to a carrier. Recently, leadless chip carriers, which are of relatively thin plate forms having multiple pads formed upon their surfaces, have become popular due to their compactness in relation to the dual-in-line carrier package. Leadless chip carriers take up less space on the printed circuit board which is important in modern compact circuit design.

Leadless chip carriers are formed of ceramic materials which have a thermal coefficient of expansion which is not ideally suited for the epoxy/glass material from which printed circuit boards are normally constructed. Therefore, in order to utilize a leadless chip carrier, a receiving device is used to connect the carrier onto a printed circuit board. These receiving devices or sockets are designed to accomodate the differential in thermal expansion of the carriers and printed circuit boards. Sockets are also utilized in testing chip carriers and have been developed to accomodate such carriers for burn-in and similar testing.

U.S. Pat. No. 4,491,377 discloses a socket having conductive elongated contacts for holding the carrier within the socket. A spreader cams the inner edge of the contacts outwardly to allow insertion of the carrier. The contacts are then released to hold the carrier firmly within the socket.

SUMMARY OF THE INVENTION

The socket of this invention includes a plurality of opposed cantilevered contacts positioned about the socket's central opening. Each contact includes an upper platform of diving board form which extends outwardly of the socket central opening. When the platforms are depressed, the contacts are flexed outwardly To allow insertion of a carrier. By releasing pressure on the platforms, the contacts are closed to secure the carrier within the socket.

Accordingly, it is an object of this invention to provide an electrical connector for an IC which is of simple and reliable construction.

Another object of this invention is to provide a socket which is for a leadless chip carrier.

Another object of this invention is to provide for a leadless chip carrier socket which has an improved carrier contacting member.

Other objects of this invention will become apparent upon a reading of the following description.

BRIEF DESCRIPTION OF THE DRAWINGS

A preferred embodiment of the invention has been depicted for purposes of illustration wherein.

DESCRIPTION OF THE PREFERRED EMBODIMENT

Figure 1:
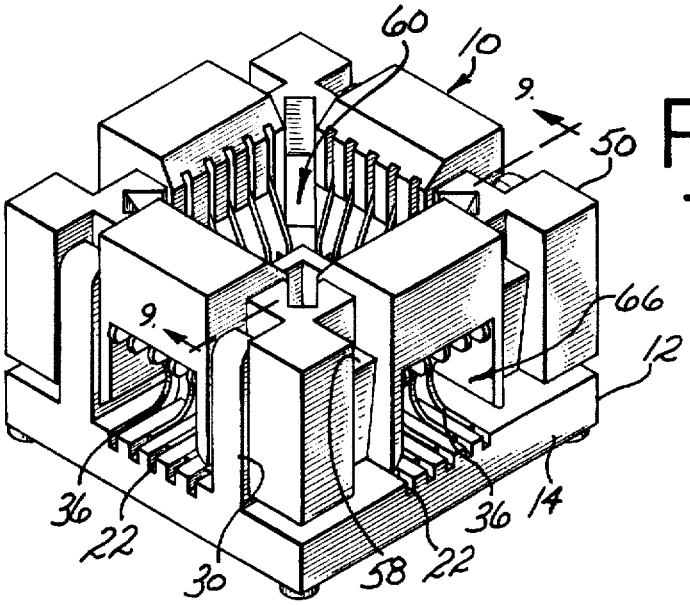
FIG. 1 is a perspective view of the socket.

The preferred embodiment herein described is not intended to be exhaustive or to limit the invention to the precise form disclosed. It is chosen and described to explain the principles of the invention, its application and its practical use to enable others skilled in the art to utilize the invention.

The socket 10 shown in the drawings includes a base member 12 having a top face 14 and bottom face 16. Base member 12 includes a central opening 18 and a plurality of peripheral bores 20 about opening 18 which extended through faces 14 and 16. A plurality of grooves 22 are cut in base member face 14. A raised table section 24 extends about central opening 18 and includes grooves 26 which are aligned with grooves 22. Base member 12 also includes two pairs of opposed finger latches 30 each of which is flexible and includes an upper camming face 32 and lock tab 34.

Socket 10 also provides for a plurality of contacts 36. Each contact 36 is constructed of resilient electrically conductive material and is of the general cross-sectional configuration shown in FIGS. 7–8. Each contact 36 has lower leads 38 which extend through base member bores 20. An integral curved neck 40 of each contact 36 is fitted into aligned grooves 22 and 26. Each contact 36 includes an integral upper head 42 having a bevelled inner edge 44 which terminates in a chin part 46 offset from the contact's neck 40 as seen in FIG. 8 and an outwardly extending integral platform 48.

Figure 2:
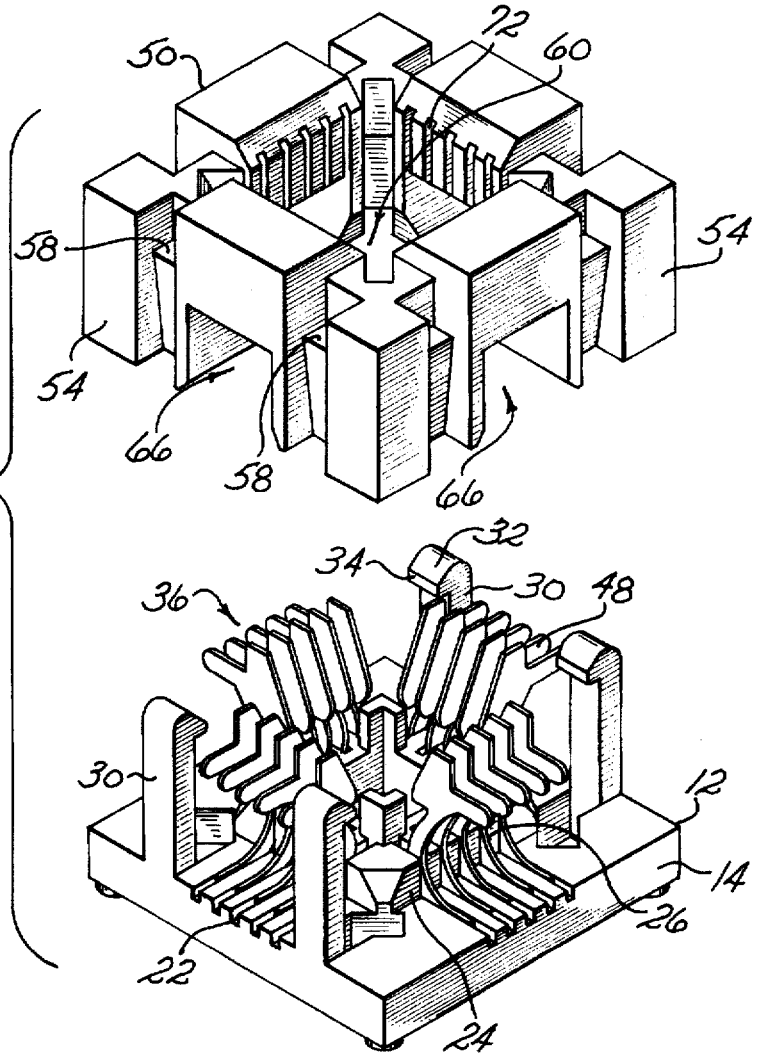
FIG. 2 is an exploded view of the socket components.
Figure 3:
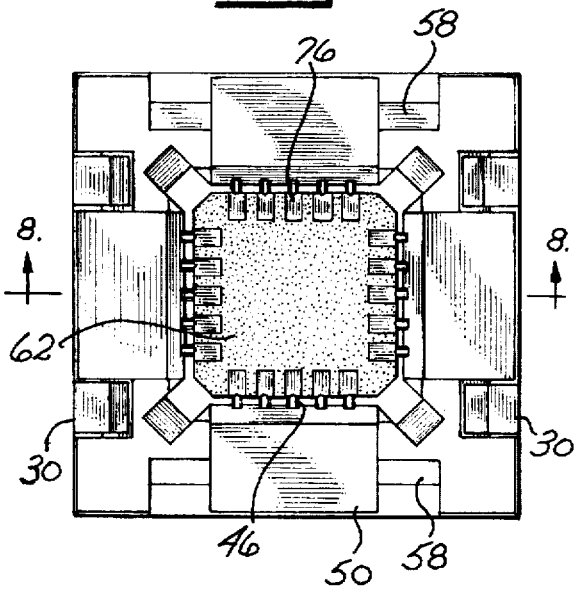
FIG. 3 is a top plan view of the socket with an integrated circuit device inserted.
Figure 6:
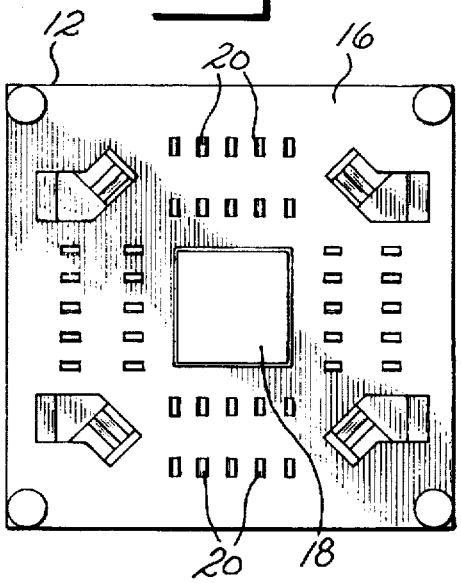
FIG. 6 is a bottom view of the socket.
Figure 4:
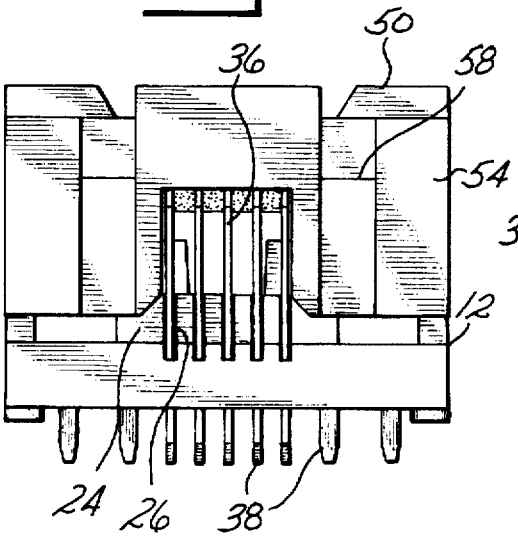
FIG. 4 is a side view of the socket.
Figure 5:
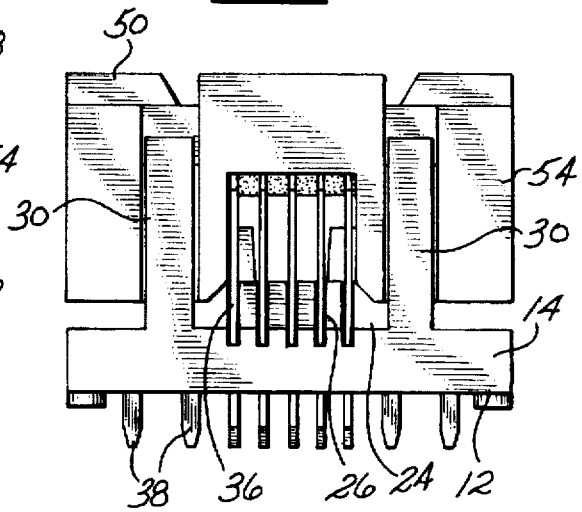
FIG. 5 is a side view of the socket.

Socket 10 also includes a top 50 having the general configuration shown in FIG. 2 and includes shoulder parts 58. Top 50 includes a central opening 60 to allow for the insertion of an integrated circuit carrier 62 into socket 10 and an abutment part 64 at each of its sides 54. As seen in FIGS. 4 and 5, top 50 includes an open channel 66 at each of its side faces 54 into center opening 60 below abutment parts 64. A plurality of grooves 72 are formed in the top next to abutment parats 64 and over channels 66.

With contacts 36 positioned in grooves 22, 26 of base member 12 and with leads 38 extending through base member bores 20, top 50 is placed over and pushed downwardly upon base member 12 until finger latches 30 of the base member engage shoulder parts 58 to secure the top of the base member. The heads 42 of contacts 36 fit into top grooves 72 with each contact platform 48 bearing against a top abutment part 64 to urge the top into its upper position as seen in FIG. 1.

Figure 7:
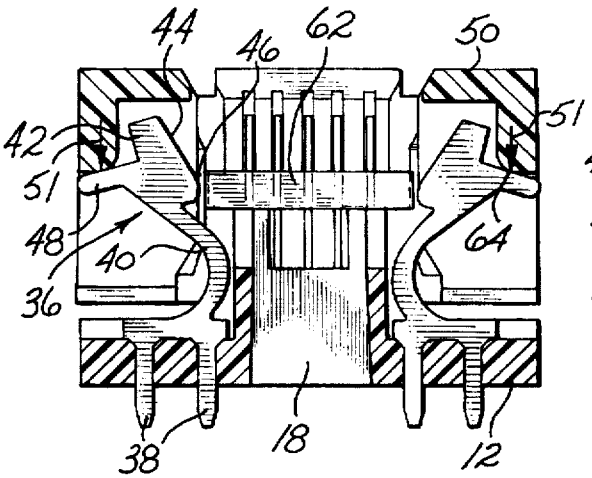
FIG. 7 is a sectional view of the socket showing a carrier being inserted.
Figure 8:
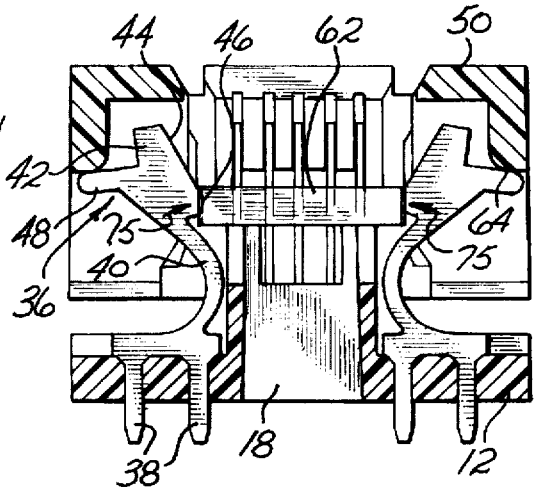
FIG. 8 is a sectional view taken along 8—8 of FIG. 3 showing the carrier in its clamped position.
Figure 9:
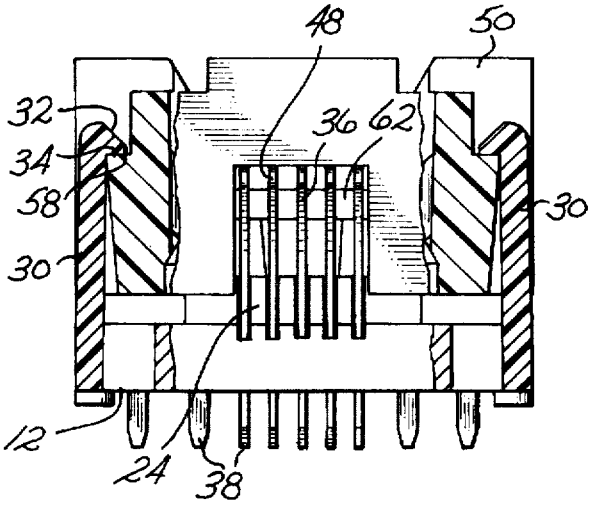
FIG. 9 is a sectional view taken along line 9—9 of FIG. 1.

To operate socket 10, top 50 is pushed downwardly towards base member 12 into its lower position as seen in FIG. 7. Abutment parts 64 urge contact platforms 48 downwardly, as shown be arrows 51 in FIG. 7. This creates a moment about contact necks 40 which causes contact heads 42 to shift outwardly so as to allow integrated circuit carrier 62 when inserted into top opening 60 to be supported atop table section 24 of the base member. Top 50 is then released. Contact platforms 48, under the influence of flexed contacts 36, urge the top upwardly away from base member 12 to allow contact chin parts 46 to compressively contact the pads of carrier 62 as shown by arrows 75 in FIG. 8. Carrier 62 is released from clamping engagement with contacts 36 by pushing top 50 downwardly into its lower position. This causes the spreading of contact heads 42 away from the carrier.

Carrier 62 may be inserted and clamped within socket 10 without pushing downwardly upon top 50. This is accomplished by simply pushing the carrier downwardly against the bevelled inner edges 44 of the contacts which in turn cams the contacts outwardly until the carrier leads engage the contact chin parts 46. The carrier is then released.

It is understood that the invention is not limited to the details above-given, but may be modified within the scope of the appended claims.

We claim:

1. A socket for a leadless chip carrier, said socket including a base member having a central opening therein, a plurality of conductive resilient contacts for engaging conductive pads on said carrier, each contact anchored in said base member and including an upwardly extending part, said contacts positioned on at least two side edges of said base member opening, and constituting opposing clamp means for engaging said carrier within said socket, the improvement wherein each contact includes a cantilevered part projecting from its upwardly extending part outwardly of said base member opening, and a movable top overlying said base member, said top including an abutment means in contact with each said contact cantilevered part for moving and flexing said contacts in an outward direction relative to said base member opening upon movement of the top in a substantially straight line downward direction to space said contacts from said carrier to allow insertion thereof into the socket.

2. The socket of claim 1 wherein said leads are positioned at each side of said base support central opening.

3. The socket of claim 1 wherein said base support includes finger latches extending toward said top, each finger latch including a tab, said top including a shoulder for accepting said tabs and securing said finger latches whereby said top is secured to said base support.

4. The socket of claim 1 wherein each contact includes a lead anchored in said base member, said contact upwardly extending part including an integral curved neck extending from said contact lead, and a head integrally formed atop said neck having inner and outer edges, said cantilevered platform projecting outwardly from said head outer edge, said head inner edge being bevelled and terminating in a lower chin part offset from said contact neck.

5. The socket of claim 1 wherein said top is of a one-piece construction.

6. The socket of claim 5 wherein said abutment means is an abutment part extending from an outer peripheral edge of said top toward said base.

*7. A socket for a leadless chip carrier, said socket including a base member having a central opening therein, a plurality of conductive resilient contacts for engaging conductive pads on said carrier, each contact anchored in said base member and including an upwardly extending part and a head part, said contacts positioned on at least two side edges of said base member opening with the head parts thereof constituting means for engaging said carrier from opposite sides to compressively clamp the carrier between the head parts when within said socket, each contact including a cantilevered part projecting from its upwardly extending part outwardly of said base member opening, a movable top overlying said base member, said top including abutment means in contact with each said contact cantilevered part for moving and flexing said contacts in an outward direction relative to said base member opening upon movement of the top in a substantially straight line downward direction to space the contacts from said carrier to allow insertion of the carrier within the socket.*

*8. The socket of claim 7 wherein each head part includes a chin part for contacting said carrier, each cantilevered part extending above the level of each chin part.*

*9. The socket of claim 8 wherein said base member includes a table means for supporting said carrier within said socket.*

*10. A socket for a leadless chip carrier, said socket including a base member having a central opening therein, a plurality of conductive resilient contacts for engaging conductive pads on said carrier, each contact anchored in said base member and including an upwardly extending part and a head part, said contacts positioned on at least two side edges of said base member opening with the head parts thereof constituting opposing clamp means for engaging said carrier when within said socket, each contact including a cantilevered part projecting from its upwardly extending part outwardly of said base member opening, a movable top overlying said base member and including abutment means in contact with each contact cantilevered part for moving and flexing said contacts in an outward direction relative to said base member opening upon movement of the top in a substantially straight line downward direction to space said contacts from said carrier to allow insertion of the carrier within the socket, said top further including a plurality of grooves each accommodating the cantilevered part and at least a portion of the head part of each contact, each contact when moving in said outward direction further moving relative to said top within its said accommodating groove.*

*11. The socket of claim 10 wherein each head part includes a chin part for contacting said carrier, each cantilevered part extending above the level of each chin part.*

*12. A socket for a leadless chip carrier, said socket including a base member having a central opening therein, a plurality of conductive resilient contacts for engaging conductive pads on said carrier, each contact anchored in said base member and including an upwardly extending part and a head part, said contacts positioned on at least two side edges of said base member opening with the head parts thereof constituting means for engaging said carrier from opposite sides to compressively clamp the carrier between the head parts when within said socket, each contact including a cantilevered part projecting from its upwardly extending part outwardly of said base member opening, movable top overlying said base member, said top including abutment means for contacting each said contact cantilevered part to move and flex said contacts in an outward direction relative to said base member opening upon movement of the top in a substantially straight line downward direction to space the contacts from said carrier to allow insertion of the carrier within the socket.*

*13. The socket of claim 12 wherein each head part includes a chin part for contacting said carrier, each cantilevered part extending at least to the level of each chin part.*

*14. The socket of claim 13 wherein said base member includes a table means for supporting said carrier within said socket.*

*15. A socket for a leadless chip carrier, said socket including a base member constituting means for supporting*

*said carrier and having a central opening therein, a plurality of conductive resilient contacts for engaging conductive pads on said carrier, each contact anchored in said base member and including an upwardly extending part, said contacts positioned on at least two side edges of said base member opening and constituting opposing clamp means for engaging said carrier within said socket, each contact including a cantilevered part projecting from its upwardly extending part outwardly of said base member opening, and a moveable top overlying said base member, said top including an abutment means in contact with each said contact cantilevered part for moving and flexing said contacts in an outward direction relative to said base member opening upon movement of the top in a substantially straight line downward direction to space said contacts from said carrier to allow insertion thereof into the socket and into supporting contact with said base member.*

*16. A socket for a leadless chip carrier, said socket including a base member having a central opening therein, a plurality of conductive resilient contacts for engaging conductive pads on said carrier, each contact anchored in said base member and including an upwardly extending part, said contacts positioned on at least two side edges of said base member opening and constituting opposing clamp means for engaging said carrier within said socket, each contact including a cantilevered part projecting from its upwardly extending part outwardly of said base member opening, and a moveable top overlying said base member, said top including an abutment means in contact with each said contact cantilevered part for moving and flexing said contacts in an outward direction relative to said base member opening upon movement of the top in a substantially straight line downward direction to space said contacts from said carrier to allow insertion thereof into the socket, said top thereafter being moveable relative to said carrier in an upward direction to allow said contacts to flex in an inward direction relative to said base member opening and engage said carrier.*

* * * * *